United States Patent
Weiser

(10) Patent No.: US 11,257,907 B2
(45) Date of Patent: Feb. 22, 2022

(54) HIGH VOLTAGE DEMOS TRANSISTOR WITH IMPROVED THRESHOLD VOLTAGE MATCHING

(71) Applicant: TEXAS INSTRUMENTS INCORPORATED, Dallas, TX (US)

(72) Inventor: Doug Weiser, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/823,638

(22) Filed: Mar. 19, 2020

(65) Prior Publication Data

US 2020/0219977 A1 Jul. 9, 2020

Related U.S. Application Data

(62) Division of application No. 15/857,980, filed on Dec. 29, 2017, now Pat. No. 10,629,683.

(51) Int. Cl.
*H01L 29/08* (2006.01)
*H01L 29/78* (2006.01)
(Continued)

(52) U.S. Cl.
CPC .... *H01L 29/0878* (2013.01); *H01L 21/26586* (2013.01); *H01L 21/823418* (2013.01);
(Continued)

(58) Field of Classification Search
CPC ..... H01L 29/08; H01L 29/0878; H01L 29/78; H01L 29/66; H01L 29/66681; H01L 29/7816; H01L 29/7835; H01L 29/66492; H01L 29/66659; H01L 29/0653; H01L 29/0847; H01L 21/823493; H01L 21/823418; H01L 21/26586; H01L 21/823807; H01L 21/823892; H01L 27/088; H01L 27/0925; H01L 27/0928; H01L 27/11855; H01L 29/06; H01L 27/0908; H01L 2027/11855; H01L 29/7833; H01L 29/7836; H01L 29/0873; H01L 29/0886; H01L 29/66674; H01L 29/66734; H01L 29/7801; H01L 29/7826; H01L 29/04; H01L 29/045; H01L 29/16; H01L 29/1608; H01L 29/18; H01L 29/22;
(Continued)

(56) References Cited

U.S. PATENT DOCUMENTS 7,145,203 B2 * 12/2006 Wang ................. H01L 29/0653
257/339
7,972,917 B2 7/2011 Furuhata et al.
(Continued)

*Primary Examiner* — Chuong A Luu
(74) *Attorney, Agent, or Firm* — Andrew R. Ralston; Charles A. Brill; Frank D. Cimino

(57) ABSTRACT

A semiconductor device includes a semiconductor substrate having a first conductivity type. First and second wells are located within the substrate, the first well being formed with a dopant of the first conductivity type, e.g. n-type, and the second well formed with a dopant of a second different conductivity type, e.g. p-type. A doped gap region is located between the first and second wells. The doped gap region is formed with a dopant of the second conductivity type, e.g. p-type, at a lower dopant concentration than the dopant concentration in the second well.

18 Claims, 4 Drawing Sheets

(51) Int. Cl.
    *H01L 29/66*       (2006.01)
    *H01L 21/265*     (2006.01)
    *H01L 27/088*     (2006.01)
    *H01L 21/8234*    (2006.01)
    *H01L 21/225*     (2006.01)

(52) U.S. Cl.
    CPC .... *H01L 21/823493* (2013.01); *H01L 27/088* (2013.01); *H01L 29/66681* (2013.01); *H01L 29/7816* (2013.01); *H01L 21/2253* (2013.01)

(58) Field of Classification Search
    CPC ... H01L 29/2206; H01L 29/36; H01L 29/365; H01L 29/0856; H01L 29/0869
    USPC ......................................................... 257/336
    See application file for complete search history.

(56) References Cited

U.S. PATENT DOCUMENTS

| | | |
|---|---|---|
| 8,536,648 B2 | 9/2013 | Shrivasta et al. |
| 9,472,511 B2 | 10/2016 | Lee et al. |
| 9,680,011 B2 | 6/2017 | Zhang et al. |
| 2005/0110081 A1* | 5/2005 | Pendharkar ......... H01L 29/0653 257/336 |
| 2009/0256199 A1* | 10/2009 | Denison ............ H01L 29/66681 257/343 |
| 2010/0244106 A1* | 9/2010 | Parker ................. H01L 29/6653 257/288 |
| 2015/0200073 A1 | 7/2015 | Jen et al. |
| 2016/0197089 A1* | 7/2016 | Li ......................... H01L 29/788 257/315 |
| 2019/0067471 A1 | 2/2019 | Huang |

\* cited by examiner

HIGH VOLTAGE DEMOS TRANSISTOR WITH IMPROVED THRESHOLD VOLTAGE MATCHING

CROSS-REFERENCE TO RELATED APPLICATIONS

This application is a divisional of U.S. patent application Ser. No. 15/857,980 filed Dec. 29, 2017, which is incorporated herein by reference in its entirety.

FIELD

This disclosure relates to the field of semiconductor devices, and more specifically, but not exclusively, to an improved drain-extended MOS transistor with reduced threshold voltage offset.

BACKGROUND

Drain-extended (DE) MOS transistors have proven to be important in various integrated circuit applications, such as high-voltage input-output (I/O) ports, electrostatic discharge (ESD) robustness, power management, level shifting and power amplifiers. In some cases, such as integration of DEMOS devices with "standard" (e.g., non-DE) transistors, there may be a design imperative to ensure that the threshold voltage ($V_{TH}$) of DEMOS transistors and other transistors in the same circuit be closely matched. This objective may require compensation for $V_{TH}$ differences originating from differences between DEMOS and standard transistors.

SUMMARY

The inventor discloses various apparatus and methods that may be beneficially applied to high-voltage transistors in integrated circuits. While such embodiments may be expected to provide improvements in performance and/or reliability of such apparatus and methods, no particular result is a requirement of the present invention unless explicitly recited in a particular claim.

Embodiments of a semiconductor device, e.g. a DEMOS transistor, include a semiconductor substrate having a first conductivity type. First and second wells are located within the substrate. The first well is formed with a dopant of the first conductivity type, and the second well is formed with a first dopant of a second different conductivity type. A gap region located between the first and second wells is doped with a second dopant of the second conductivity type. A concentration of the second dopant of the second conductivity type in the gap region is less than a concentration of the first dopant of the second conductivity type in the second well. Embodiments include methods of forming a semiconductor device within the scope of the semiconductor device described above. Embodiments further include integrated circuits including a circuit substrate having a semiconductor device formed thereon within the scope of the semiconductor device described above. The substrate also includes standard transistors, e.g. buried channel transistors that do not include an extended drain.

DETAILED DESCRIPTION

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events may be required to implement a methodology in accordance with the present disclosure.

Figure 1:
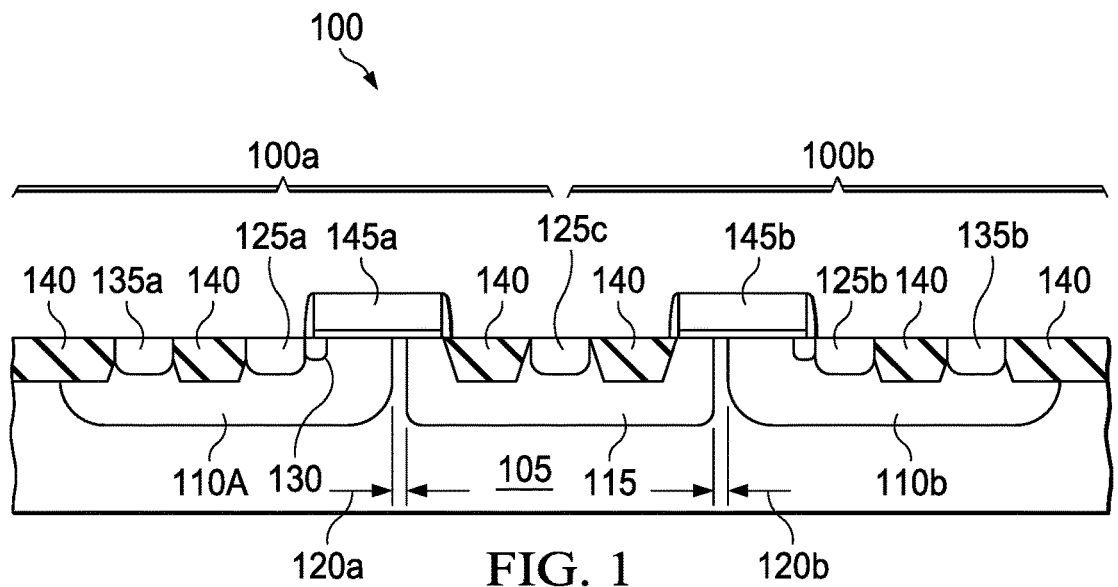
FIG. 1 illustrates a sectional view of a drain-extended metal-oxide semiconductor (DEMOS) device, including a gap region that may act as a parasitic transistor and that may increase the threshold voltage of the device.

First considering FIG. 1, a drain-extended buried channel MOS device 100 is shown. The device 100 includes two transistors 100a, 100b, and is described as a p-channel device (DEPMOS), though it could be constructed in complementary fashion as an n-channel device (DENMOS). The device 100 is formed on an n-doped epitaxial silicon substrate 105, which may be referred to for brevity as an n-epi substrate. N-doped wells 110a, 110b are formed in the substrate on either side of a p-well 115. Consistent with conventional practice, gap regions 120a, 120b are located between the p-well 115 and the n-wells 110a, 110b in which the substrate has not been doped from its as-modified state. P-doped source/drain (PSD) regions 125a, 125b, 125c are respectively formed in the wells 110a, 110b and 115, with a source/drain extension 130 located in each of the n-wells 110a, 110b. The PSD region 125c may operate as a common drain to the transistors 100a, 100b. N-doped source/drain (NSD) regions 135a, 135b are formed in the n-wells 110a, 110b, and may operate as back-gate connections to the device 100. Isolation regions 140 are located between each source/drain region and its neighboring source/drain region. Gate electrodes 145a, 145b are respectively located over the gap regions 120a, 120b, and include unreferenced gate dielectric and gate sidewalls.

In the device 100, the gap region 120 may behave as a parasitic surface PMOS transistor, and have the effect of adding a small offset to the turn-on threshold voltage $V_{TH}$ of the device 100, e.g., about 50 mV. When the device 100 is integrated with standard PMOS buried channel devices it is generally desirable that the device 100 have the same threshold voltage as such PMOS devices. Thus the offset produced by the parasitic PMOS transistor in the gap region 120 is often undesirable due to measures that must be taken to compensate for the $V_{TH}$ offset.

The disclosure benefits from the recognition by the inventor that when the dopant concentration in the gap region 120 is high enough to convert the gap region 120 to the same conductivity type as the p-well 115, but not so high as to extend the p-well 115 into the gap region 120, then the gap region 120 may operate as a drift region, thereby reducing the parasitic capacitance effect and adding a small but manageable parasitic resistance to the transistors 100a, 100b. Thus the $V_{TH}$ offset produced by the gap region 120 may be reduced or even effectively eliminated, providing uniform $V_{TH}$ on the same substrate for standard buried channel MOS transistors and drain-extended buried channel MOS devices constructed consistent with the described embodiments. As used herein, "standard buried channel MOS transistor" is defined as a buried channel transistor that lacks an extended drain, e.g., the source/drain regions are of one conductivity type and are both located within a same well of the opposite conductivity type.

Figure 2A:
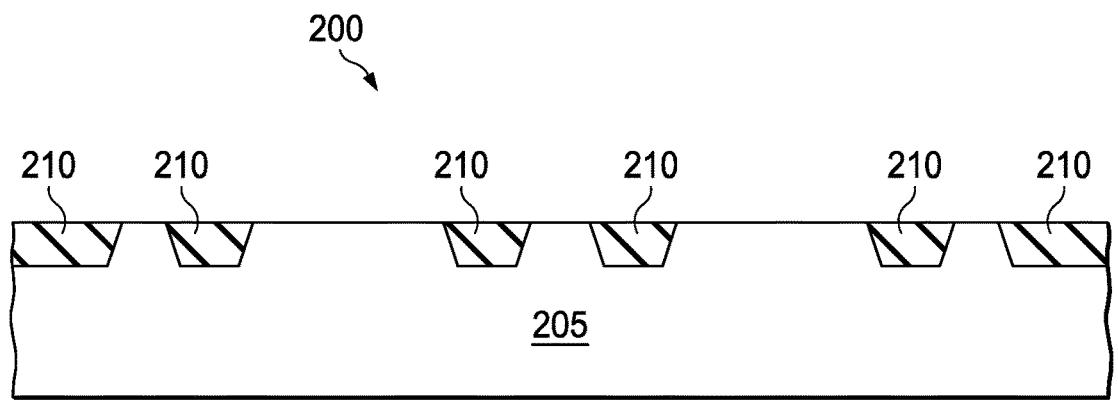
FIGS. 2A-2E show in sectional view an improved DEMOS device, according to various embodiments, in sequential stages of fabrication.
Figure 2B:
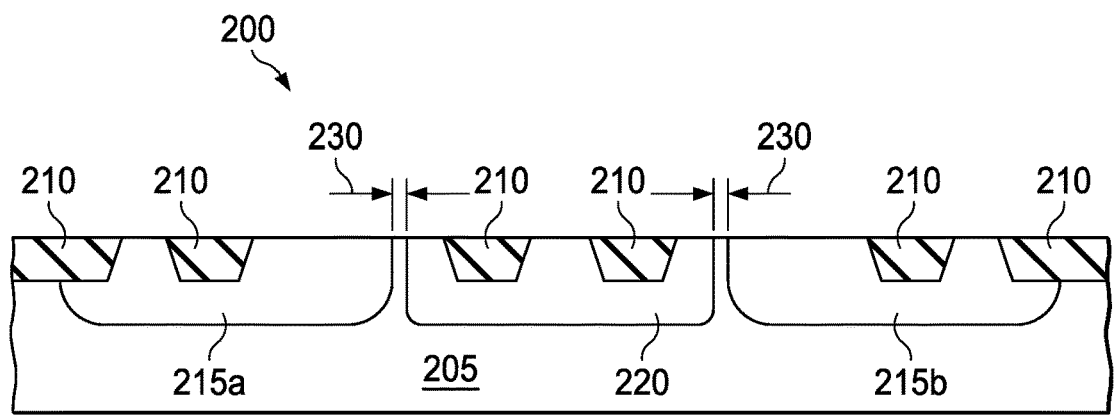
Figure 2C:
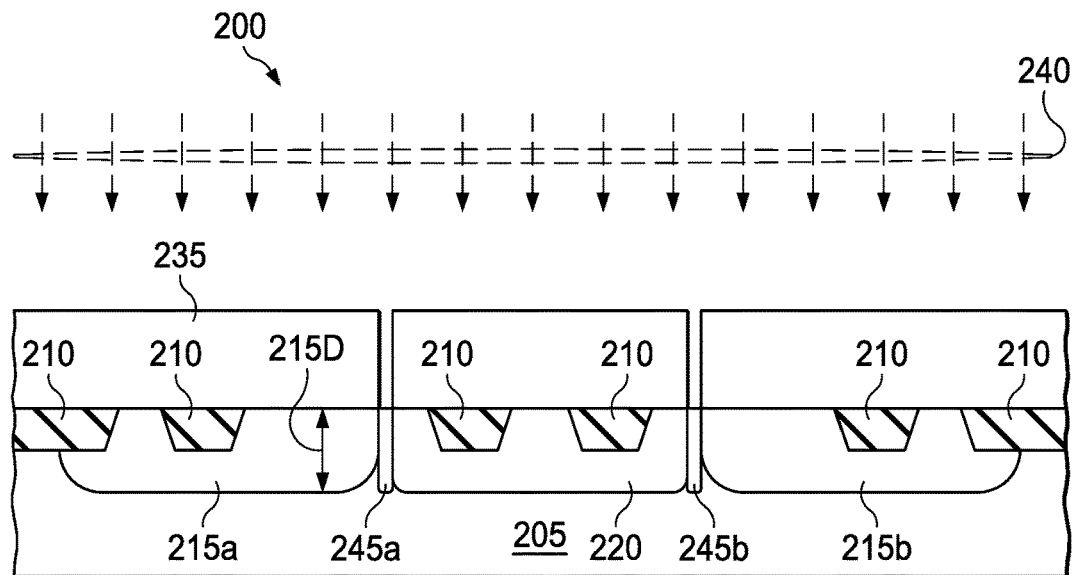
Figure 2D:
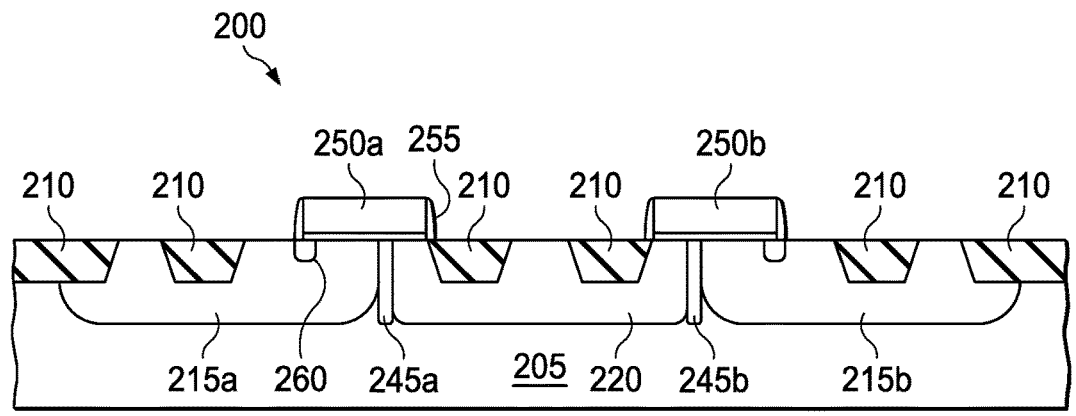
Figure 2E:
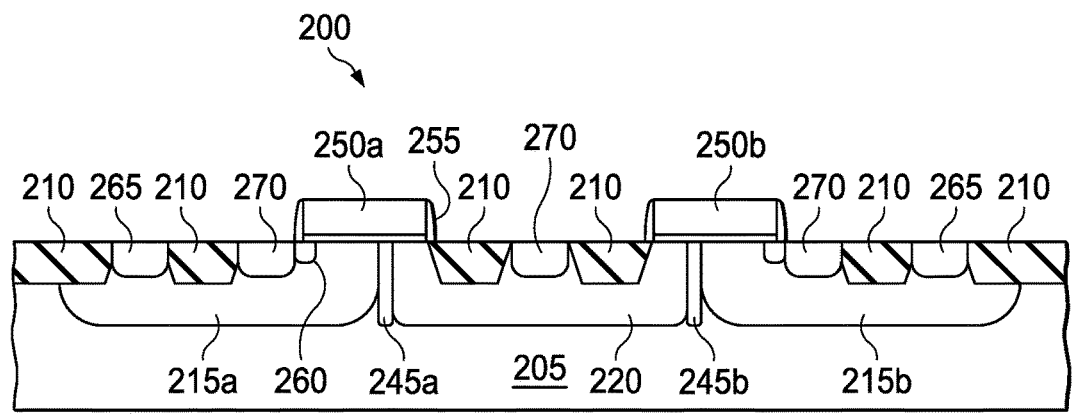
Figure 3:
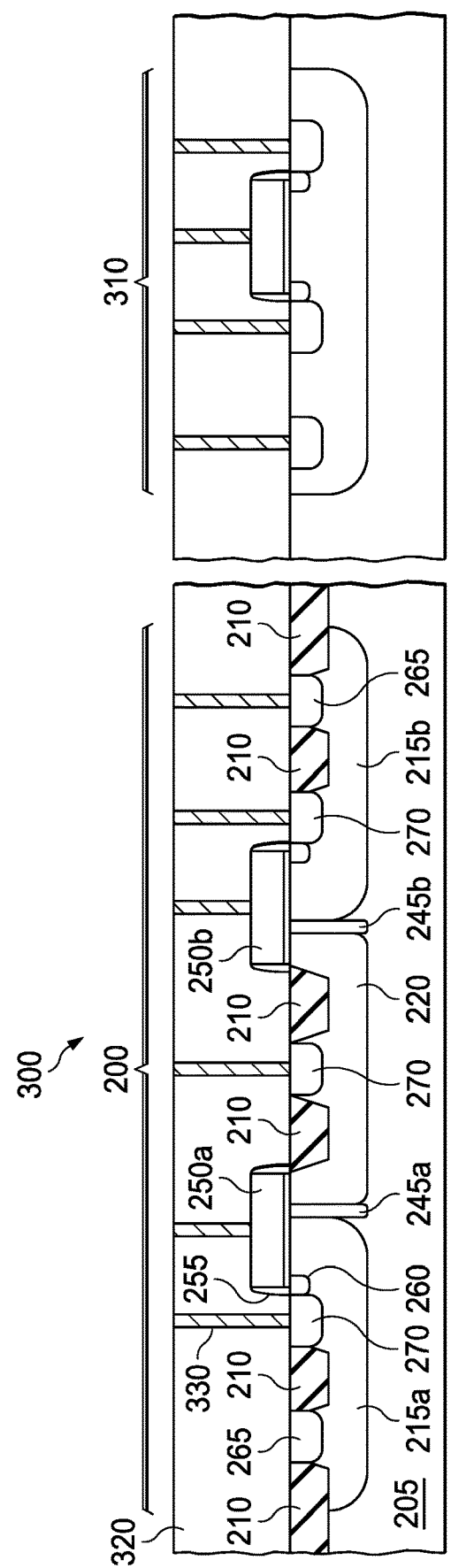
FIG. 3 illustrates an integrated circuit including a standard buried channel MOS transistor and the DEMOS device of FIGS. 2A-2E at a later stage of fabrication.

FIGS. 2A-2E illustrate an example electronic device 200 in accordance with various embodiments at progressive stages of manufacturing, and FIG. 3 illustrates the device integrated with a standard buried channel MOS transistor. Without limitation thereto, some aspects of the device 200 are described as a DEMOS (drain-extended MOS) device, and sometimes more specifically a DEPMOS device. Those skilled in the pertinent art can readily adapt the described principles to DENMOS devices.

In FIG. 2A, a semiconductor substrate 205, e.g. a doped epitaxial layer of a handle wafer, has been processed to form isolation structures 210. Without limitation the isolation structures are described as shallow trench isolation (STI) structures. In other embodiments, other types of isolation may be used, e.g., LOCOS. The substrate 205 may comprise any semiconductor material suitable for the device 200, e.g. Si, Ge, or GaAs. Embodiments herein are described without limitation as being formed on a Si substrate. Those skilled in the semiconductor arts can readily make suitable modifications for other semiconductor materials. In some embodiments the substrate 205 includes an epitaxial silicon layer that has been doped with a dopant of a first conductivity type. For example, the epitaxial layer may be an n-type epitaxial layer for a PMOS device.

FIG. 2B shows the device 200 after formation of wells 215a, 215b and 220. The wells 215a, 215b have been doped with a dopant of the first conductivity type, and the well 220 has been doped with a dopant of a second conductivity type. These wells may be formed by implanting the desired dopant using a conventional implant process. In some embodiments, e.g. for a PMOS device, the dopant of the first conductivity type is an n-type dopant that may be selected from P, As and Sb, and the dopant of the second conductivity is p-type and may be selected from B and In. Conversely, for an NMOS device, the dopant of the first conductivity type is p-type, while the dopant of the second conductivity type is n-type. As was described for the device 100, the design of the device 200 results in a gap 230 between the wells 215a, 215b and the well 220. This aspect is discussed in greater detail below.

Referring to FIG. 2C, a resist pattern 235 has been formed that provides openings over the regions between the wells 215a, 215b and the well 220. An implant process 240 provides dopant atoms of the second conductivity type to these regions to form doped gap regions 245a, 245b. Thus the well 220 and the doped gap regions 245a, 245b have a same conductivity type. Prior to the process 240, the gap regions 245a, 245b may be referred to as "native" portions of the substrate 205. In the Specification and the Claims "native", as applied to the substrate 205, refers to that portion of the substrate 205 that has not been substantively altered from its state immediately prior to the formation of the isolation regions 205. Examples of substrate alteration include direct implantation of a dopant, a change of resistance greater than 10%, and a change of conductivity type. A native portion may indirectly receive dopant atoms from an implant step, e.g. via diffusion from a neighboring region, and still be considered a native substrate portion under this definition.

In various embodiments the concentration of the dopant after the implant process 240 in the gap regions 245a, 245b is less than the concentration of the dopant in the well 220, and may be referred to as "lightly doped" without loss of generality. In various embodiments the process 240 provides dopants in multiple steps at different energies, concentrations, and/or tilt angles. Such an implant may be referred to as a chained implant. A final concentration of the dopant may be just large enough to convert the doped gap regions 245a, 245b from the first conductivity type to the second conductivity type, e.g., n-type to p-type when the substrate 205 includes n-type epitaxial silicon. At an upper concentration limit, the doped gap regions 245a, 245b should not be doped at a concentration high enough to merge the doped gap regions 245a, 245b with the well 220. In a various embodiments the dopant concentration in the doped gap regions 245a, 245b is in a range that converts these regions to drift regions. This aspect is discussed in greater detail below. In various embodiments the doped gap regions 245a, 245b extend into the substrate 205 at least as far as a well depth 215D of the wells 215a, 215b. As used herein, the term "well depth" refers the depth below the surface of the substrate at which the dopant concentration in the well is three orders of magnitude below (0.1%) a maximum dopant concentration within the well.

Those skilled in the pertinent art will appreciate that suitable process steps may be determined as a function of one or more of semiconductor substrate type, well depth, well dopant concentration, and dopant species. In general the objective is to achieve a relatively uniform dopant profile through the depth 215D between the wells 215 and the well 220, with sufficient dopant concentration to convert the substrate 205 in this region from the first conductivity type to the second conductivity type. In some embodiments the dopant concentration in the doped gap regions 215a, 215b is limited to about one half or less of the dopant concentration in the well 220. Such conditions may be determined by one skilled in the pertinent art without undue experimentation.

In an example embodiment, the device 200 is a PMOS device, and the process 240 is performed on any of a number of suitable commercially available ion implantation tools to implant boron into the doped gap regions in 245a, 245b in a six-step implant chain as follows:

| Step 1 | 4.0e11 atoms/cm$^2$ | 600 keV | Tilt = 2 4-quad |
|---|---|---|---|
| Step 2 | 4.0e11 atoms/cm$^2$ | 430 keV | Tilt = 2 4-quad |
| Step 3 | 4.0e11 atoms/cm$^2$ | 280 keV | Tilt = 0 |
| Step 4 | 4.0e11 atoms/cm$^2$ | 150 keV | Tilt = 0 |
| Step 5 | 4.0e11 atoms/cm$^2$ | 60 keV | Tilt = 0 |
| Step 6 | 2.5e11 atoms/cm$^2$ | 20 keV | Tilt = 7 |

This specific implant chain may be appropriate, e.g., for embodiments formed on silicon and having a well depth 215D of about 1 μm. In some embodiments, the boron dose may be as much as 50% larger than this example process, e.g., up to about 6.0e11 atoms/cm$^2$.

FIG. 2D illustrates the device 200 after formation of gate electrodes 250a, 250b, with unreferenced gate oxide, gate sidewalls 255 and drain extensions 260. Each of these features may be formed by conventional methods. The gate electrodes 250a, 250b overlie a portion of the well 220 and a portion of a respective one of the wells 215a, 215b. The gate electrodes 250a, 250b respectively overlie an entirety doped gap regions 245a, 245b.

FIG. 2E illustrates the device 200 after formation of body contact regions 265 and source/drain regions 270. The body contact regions 265 are formed using an implanted dopant of the first conductivity type, while the source/drain regions 270 are formed using an implanted dopant of the second conductivity type. Thus, for a PMOS device the body contact regions 265 may be n-doped and the source/drain regions may be p-doped. Dopants in the regions 245a, 245b may be activated by a diffusion step, e.g., a rapid thermal anneal (RTA) or a furnace anneal, that follows the source/drain implants.

FIG. 3 illustrates an integration circuit (IC) 300 including the device 200 and a representative standard buried channel MOS transistor 310. The IC 300 is shown after formation of a dielectric layer 320 and contacts 330. Additional interconnect layers, not shown, may connect the device 200 and transistor 310 to other electronic devices within the IC 300.

The operation of the device 200 is described for the case that that the device 200 is a PMOS device. In other words, in this example the substrate 205 is n-epi, the wells 215 are n-wells, and the well 220 is a p-well. In the absence of the doped gap region 245a, the space between the well 215a and the well 220 comprises native n-epi, resulting in the aforementioned parasitic capacitance. When the device 200 is constructed consistent with the described embodiments, the doped gap region 245 behaves as a drift region. Thus little or no depletion occurs in the doped gap region 245 under the gate electrode 250, and parasitic capacitance that would otherwise increase the $V_{TH}$ is prevented. In this case, the region 245 adds a small parasitic resistance to the current path between the source and drain of the device 200 that can be easily accounted for in a circuit design.

Figure 4:
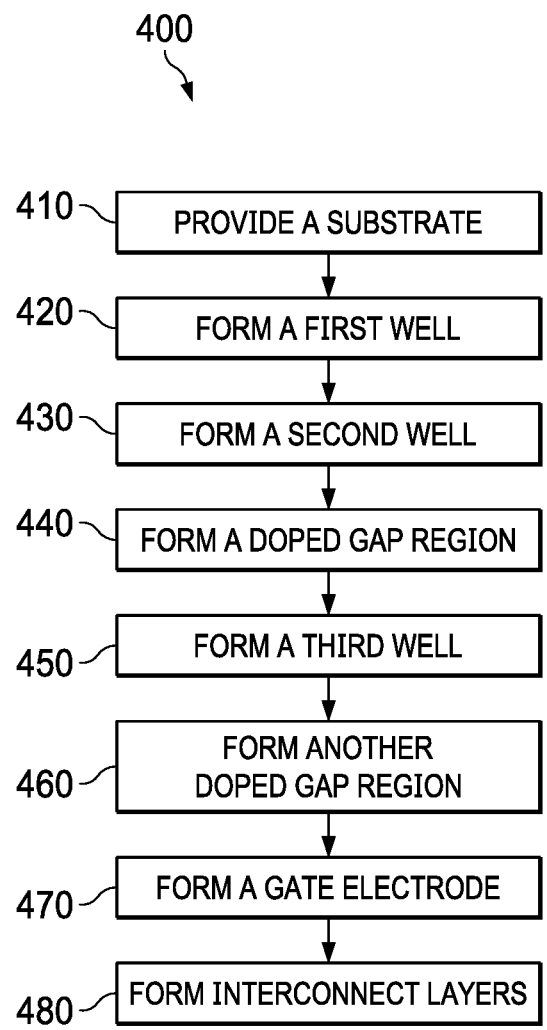
FIG. 4 illustrates a method of forming an electronic device, e.g. a DEMOS transistor, according to the device described in FIGS. 2A-2E.

Finally, FIG. 4 presents a method 400 for forming a semiconductor device according to the described embodiments. While presented in a displayed order, some steps of the method 400 may be omitted, performed in another order, or performed concurrently with other steps. In a step 410 a semiconductor substrate is provided that has a first conductivity type, e.g. n-type. In a step 420 a first well, e.g. the well 215a, is formed within the semiconductor substrate. The first well is formed with a dopant of the first conductivity type. In a step 430 a second well, e.g. the well 220, is formed within the semiconductor substrate. The second well is formed with a first dopant of a second different conductivity type, e.g. p-type. In a step 440 a second dopant of the second conductivity type is implanted into the substrate between the first and second wells, thereby forming a doped gap region, e.g., the doped gap region 245a. The second dopant is implanted with a dopant concentration less than a dopant concentration in the second well, e.g., about one half or less of the dopant concentration in the well 220.

In a step 450 a third well, e.g. the well 215b, is formed within the substrate with the dopant of the first conductivity type. In a step 460 the second dopant of the second conductivity type is implanted into the substrate between the second and third wells, thereby forming another doped gap region, e.g. the doped gap region 245b. It may be preferable for manufacturing efficiency for steps 450 and 460 to be concurrently performed respectively with steps 420 and 440.

In a step 470 a transistor gate electrode is formed over the doped gap region, thereby producing a buried channel DEMOS transistor having reduced $V_{TH}$ with respect to a corresponding conventional DEMOS transistor. In a step 480, dielectric layers and interconnects are formed over the DEMOS transistor, thereby connecting the transistor to other electronic devices of an integrated circuit, e.g. a standard buried channel MOS transistor.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. An integrated circuit, comprising:
   a semiconductor substrate doped with a dopant species of a first conductivity type; and
   a first drain-extended MOS (DEMOS) transistor, comprising:
   a first well located within the substrate and formed with a dopant of the first conductivity type;
   a second well located within the substrate and formed with a first dopant of a second different conductivity type; and
   a third well located within the substrate and being formed with the dopant of the first conductivity type;
   a first doped gap region located between the first and second wells, the doped gap region being formed within the substrate with a second dopant of the second conductivity type at a dopant concentration less than a dopant concentration in the second well; and
   a second doped gap region located within the substrate and being formed from the second dopant of the second conductivity type between the second well and the third well.

2. The integrated circuit of claim 1, wherein said semiconductor substrate includes an n-type epitaxial layer.

3. The integrated circuit of claim 1, wherein said first conductivity type is n-type and said second conductivity type is p-type.

4. The integrated circuit of claim 1, wherein said first well has a well depth, and said first doped gap region has a depth at least as deep as said well depth.

5. The integrated circuit of claim 1, wherein said first doped gap region is formed in a native portion of said substrate.

6. The integrated circuit of claim 1, wherein said first doped gap region is capable of operating as a carrier-drift region in the event that a bias is placed on a gate electrode overlying the first doped gap region.

7. The integrated circuit of claim 1, wherein a dopant concentration in said first doped gap region is about one half or less of a concentration of said dopant in said second well.

8. An integrated circuit, comprising:
   a semiconductor substrate doped with a dopant species of a first conductivity type; and
   a first drain-extended MOS (DEMOS) transistor, comprising:
   a first well located within said substrate and formed with a dopant of said first conductivity type;
   a second well located within said substrate and formed with a first dopant of a second different conductivity type;
   a first doped gap region located between said first and second wells, said first doped gap region being formed within said substrate with a second dopant of said second conductivity type at a dopant concentration less than a dopant concentration in said second well; and a first gate electrode located over said first doped gap region and said first and second wells; and a second DEMOS transistor, comprising:

said second well, a third well located within said substrate and formed with a dopant of said first conductivity type;

a second doped gap region located between said second and third wells, said second doped gap region being formed within said substrate with said second dopant of said second conductivity type at a dopant concentration less than a dopant concentration in said second well; and a second gate electrode located over said second doped gap region and said second and third wells.

9. The integrated circuit of claim 8, further comprising a plurality of standard buried channel MOS transistors formed in or over said substrate and having a same threshold voltage as said first and second DEMOS transistors.

10. A semiconductor device, comprising:

a drain-extended metal-oxide-semiconductor (DE-MOS) transistor having a threshold voltage ($V_{TH}$), including:

a first well having a first conductivity type within a semiconductor substrate and including a dopant species of the first conductivity type;

a second well having a second different conductivity type within the semiconductor and including a first dopant species of the second conductivity type; and a doped gap region between and touching the first and second wells, the doped gap region having the second conductivity type and including a second dopant species of the second conductivity type at a concentration less than the first dopant species of the second conductivity type in the second well; and a standard buried-channel MOS transistor in or over the semiconductor substrate and having a same $V_{TH}$ as the DE-MOS transistor.

11. The semiconductor device of claim 10, wherein the semiconductor substrate is an n-epi substrate.

12. The semiconductor device of claim 10, wherein the first conductivity type is n-type, and the second conductivity type is p-type.

13. The semiconductor device of claim 10, wherein the first and second wells have a well depth, and the doped gap region has a depth at least as deep as the well depth.

14. The integrated circuit of claim 10, further comprising a transistor gate electrode over the doped gap region.

15. The semiconductor device of claim 10, wherein the first dopant species of the second conductivity type and the second dopant species of the second conductivity type are a same dopant species.

16. The semiconductor device of claim 10, further comprising:

a first gate electrode over the first doped gap region;

a drain region in the second well with a dopant of the second conductivity type; and a source region in the n-type well.

17. The semiconductor device of claim 10, wherein the doped gap region has a dopant concentration less than that of the second well.

18. The semiconductor device of claim 10, wherein the concentration of the second dopant species of the second conductivity type in the doped gap region is no greater than 50% the concentration of the second dopant species of the second conductivity type in the second well.

* * * * *